United States Patent [19]

Yamamoto et al.

[11] Patent Number: 4,817,849
[45] Date of Patent: Apr. 4, 1989

[54] METHOD FOR BONDING SEMICONDUCTOR LASER ELEMENT AND APPARATUS THEREFOR

[75] Inventors: Akihiro Yamamoto, Hirakata; Yutaka Makino, Toyonaka; Shinji Kaino, Hirakata, all of Japan

[73] Assignee: Matsushita Electric Industrial Co., Ltd., Kadoma, Japan

[21] Appl. No.: 93,678

[22] Filed: Sep. 8, 1987

[30] Foreign Application Priority Data

Sep. 9, 1986 [JP] Japan ................. 61-212283

[51] Int. Cl.$^4$ ................. H01S 3/18; B23K 11/00; B23K 11/32
[52] U.S. Cl. ................. 228/103; 228/105; 228/123; 228/9; 228/44.7; 228/49.1; 156/64; 29/593; 29/834; 437/209; 219/85.1; 219/85.16
[58] Field of Search ............... 228/103, 105, 123, 212, 228/8, 9, 44.7, 49.1; 156/64; 29/593, 833, 834; 437/209, 129

[56] References Cited

U.S. PATENT DOCUMENTS 3,448,280  6/1969  Blitchington, Jr. et al. ....... 228/105
4,443,494  4/1984  Gonser ................................. 156/64
4,457,464  7/1984  Klement et al. ..................... 228/103
4,557,043  12/1985  Starski ................................ 29/593

FOREIGN PATENT DOCUMENTS 61-174688  8/1986  Japan .

OTHER PUBLICATIONS

*IBM Technical Disclosure Bulletin,* "Testing Method . . .", vol. 15, No. 6, Nov. 1972.

*Primary Examiner*—Nicholas P. Godici
*Assistant Examiner*—Samuel M. Heinrich
*Attorney, Agent, or Firm*—Cushman, Darby & Cushman

[57] ABSTRACT

A method for bonding a semiconductor laser element, wherein a laser chip (4) is mounted on a stem (1) and a driving electric power is supplied to the laser chip through members for mounting the laser chip so that the laser chip emits a laser light, then the direction of the laser light is examined, and position of the laser chip is adjusted, in a manner that the direction of the laser light becomes within a predetermined range, and subsequently the laser chip is bonded on the pedestal (2) upon detection of entering the direction in the range, by flowing a large current through in the pedestal (2).

2 Claims, 8 Drawing Sheets

METHOD FOR BONDING SEMICONDUCTOR LASER ELEMENT AND APPARATUS THEREFOR

FIELD OF THE INVENTION AND RELATED ART STATEMENT

1. Field of the Invention

The present invention relates to a method for bonding a semiconductor laser element and an apparatus for carrying out the method.

2. Description of the Related Art

The general constitution of a semiconductor laser device is shown in FIG. 8. Referring to FIG. 8, a laser chip 54 is mounted on a pedestal 52 with an intermediate chip 53 therebetween. The pedestal 52 is formed on a stem 51 in one body therewith and a PIN photodiode 55 for detecting a laser light which is radiated from the laser chip 54 is mounted on the stem 51. The signal detected by the PIN photodiode 55 is used to control the intensity of the laser light (the description of a control system therefor is known and is omitted). The stem 51 is provided with three lead wires 56, 57 and 58, and the lead wire 56 is electrically connected to the stem 51. Other lead wires 57 and 58 are inserted through and fixed in holes not shown of the stem 51 with insulating members 63 therebetween. The lead wire 57 is connected with the PIN photodiode 55 by a gold wire 59, and the lead wire 58 is connected with the laser chip 54 by a gold wire 62.

In the semiconductor laser device, as shown in FIG. 10, a direction of an emitted light from the laser chip 54 is required to be in a range of a designed predetermined angle $\theta$ with respect to a predetermined axis "O" of the semiconductor laser device. Furthermore, as shown in FIG. 9, a distance "A" between a surface of the stem 51 and an end of the laser chip 54 is required to be within a tolerance of several ten microns. Moreover, a distance "d" between an end of the intermediate chip 53 and the end of the laser chip 54 is also required to be within the range of 0-20 micron.

In the prior art, in order to bond the intermediate chip 53 and the laser chip 54 on a predetermined position of the pedestal 52, in its first process shown in FIG. 11(a) the laser chip 54 is mounted on a predetermined position on the intermediate chip 53 by utilizing its external shape as reference thereof, and is bonded on the intermediate chip 53. In a second process as shown in FIG. 11(b), the intermediate chip 53 bonded with the laser chip 54 is bonded on the pedestal 52. In the second process, the intermediate chip 53 is positioned by contacting at a side face 65 thereof to a wall 60 of the pedestal 52. The wall 60 is formed by taking a surface 69 of the stem 51 as a reference surface.

After the bonding process, the light emission from the laser chip 54 is examined to determined whether the direction of the light emission is in a predetermined range of angles with respect to the predetermined axis "O".

In the above-mentioned bonding process, the direction of the light emission is examined after the bonding process, and a semiconductor laser having a declination of the direction of the light emission, which is over a predetermined range, is removed as a rejected device. Hence ther is a problem that a yield rate can not be improved.

In the actual bonding process, the declination is a result of combination of three components, namely, a declination of the distance "B" between the surface 69 of the stem 51 and the wall 60, a declination of a length "C" of the intermediate chip 53 and a declination of the bonding position of the laser chip 54 with respect to the intermediate chip 53. Therefore, it is difficult to improve the accuracy of the distance "A". In a similar manner, since an error wherein the wall 60 is not parallel with respect to the surface 69 of the stem 51 and an error wherein the side surface 65 of the intermediate chip 53 is not parallel to an end surface 70 of the laser chip 54 are combined, it is very difficult to improve the declination of the direction of the light emission.

OBJECT AND SUMMARY OF THE INVENTION

An object of the present invention is to provide a method for fabricating a semiconductor laser device and an apparatus therefor, for making direction of a light emission of a laser chip within a predetermined range of degree.

The method for bonding the semiconductor laser element in accordance with the present invention comprises:

a step for mounting a laser chip on a stem of a semiconductor laser device, a step for supplying an electric power to the laser chip to make it emit a laser light, a step for examining intensity of the emitted laser light, a step for detecting a central axis of a light beam of the emitted laser light and measuring a difference between direction of the central axis and a predetermined direction, a step for adjusting the laser chip until the difference between the direction of the central axis and the predetermined direction becomes within a predetermined range, and a step for bonding the laser chip on the stem when the difference between of the central axis and the predetermined direction becomes within the predetermined range.

DESCRIPTION OF THE PREFERRED EMBODIMENT

Figure 7:
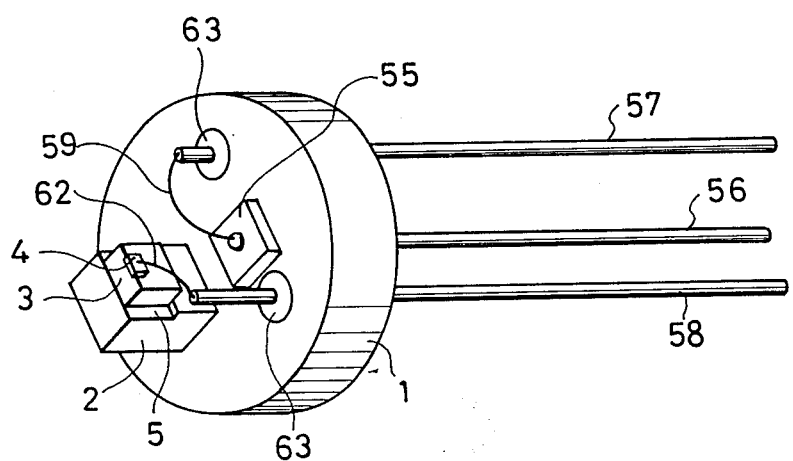
FIG. 7 is a perspective view shoiwng a semiconductor laser.
Figure 8:
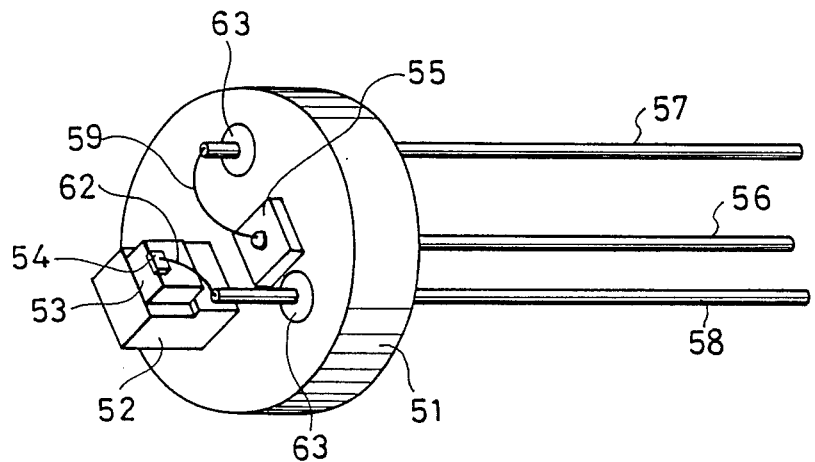
FIG. 8 is a perspective view showing the semiconductor laser in the general art.
Figure 9:
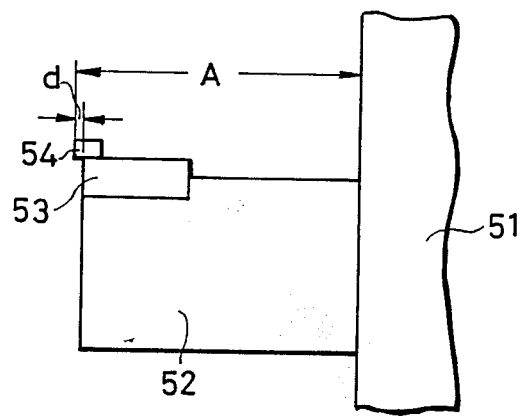
FIG. 9 is the side view showing the main portion of the semiconductor laser of FIG. 8.

Generally, in a semiconductor laser device, as shown in FIG. 7, a disc-shaped stem 1 made of copper is provided with a protrusion as a pedestal 2, and are plated with gold. The pedestal 2 is generally made integral with the stem 1. A bonding surface 5 for an intermediate chip 3 is formed on one side of the pedestal 2. The intermediate chip 3 is made of a chip of silicon plate, and the surface is plated within tin. A laser chip 4, a surface of which is plated with gold, is bonded on the intermediate chip 3.

The stem 1 has three lead wires 56, 57 and 58, each bonded thereto at one end. The lead wire 56 is connected to the stem 1. Other lead wires 57 and 58 are insulated from the stem 1 by an insulating member 63. A PIN photodiode 55 is detecting a laser light which is radiated from the laser chip 54 is mounted on the stem 1, and the lead wire 57 is connected to the PIN photodiode 55 by a gold wire 59. The signal detected by the PIN photodiode 55 is used to control the intensity of the laser light (the description of a control system therefor is omitted). The laser chip 4 is connected with the lead wire 58 by a gold wired 62.

Figure 2:
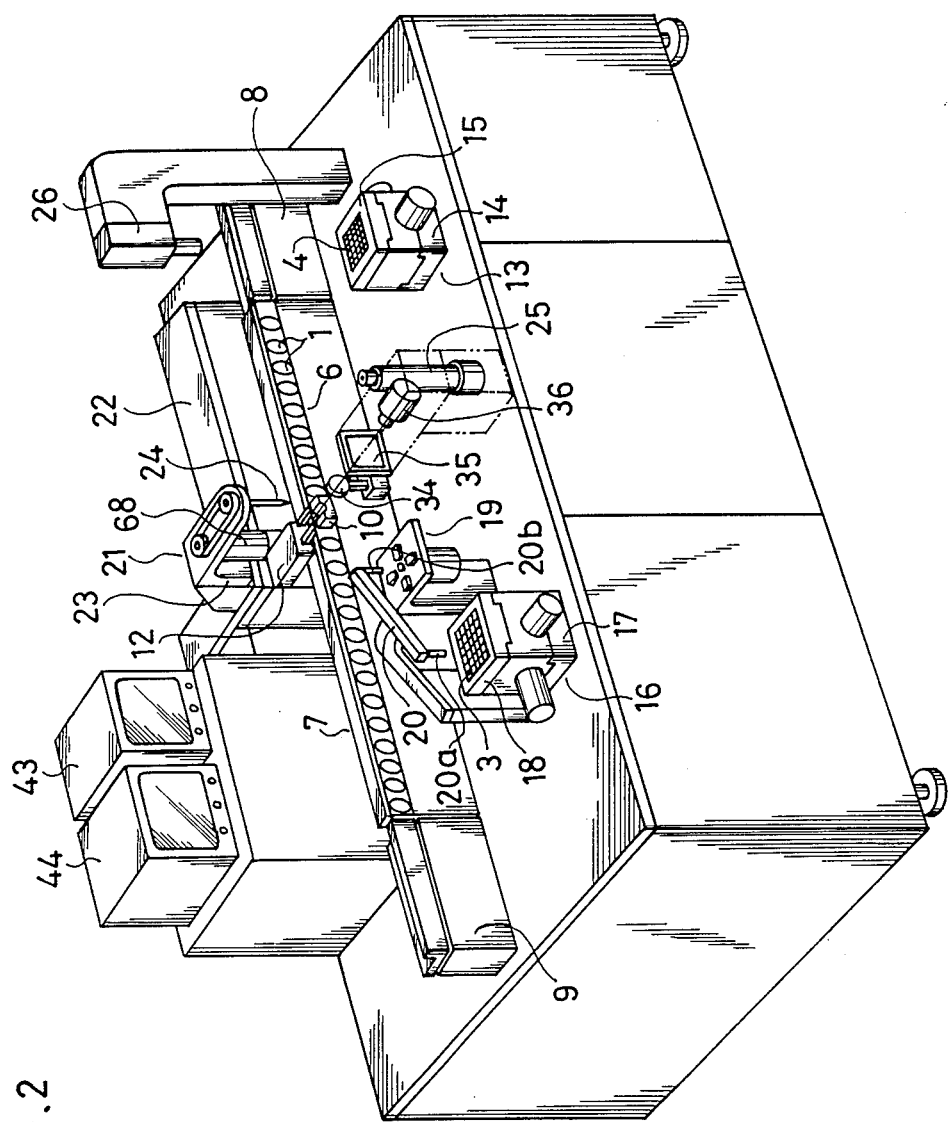
FIG. 2 is a perspective view of an apparatus for embodying the bonding method in accordance with the present invention, wherein very small parts are drawn enlarge to enable drawing.

An example of a bonding apparatus for embodying the method for bonding semiconductor laser element is shown in FIG. 2. Referring to FIG. 2, a transfer device 7 transfers a plurality of stems 1, and blank stems 1 are supplied from a supply portion 8, and assembled stems are issued from an issuing portion 9. A stem holder 10 and a positioning device 12 are provided on a central portion of the transfer device 7, and a stem 1 in the transfer device 7 is positioned in the stem holder 10 by operation of the positioning device 12. A laser chip supplying part 13 comprises a tray 15 for holding a plurality of laser chips 4, and an X-Y table 14 for carrying the tray 15. An intermediate chip supplying part 16 comprises a tray 18 for holding a plurality of intermediate chips 3 and an X-Y table 17.

Figure 3:
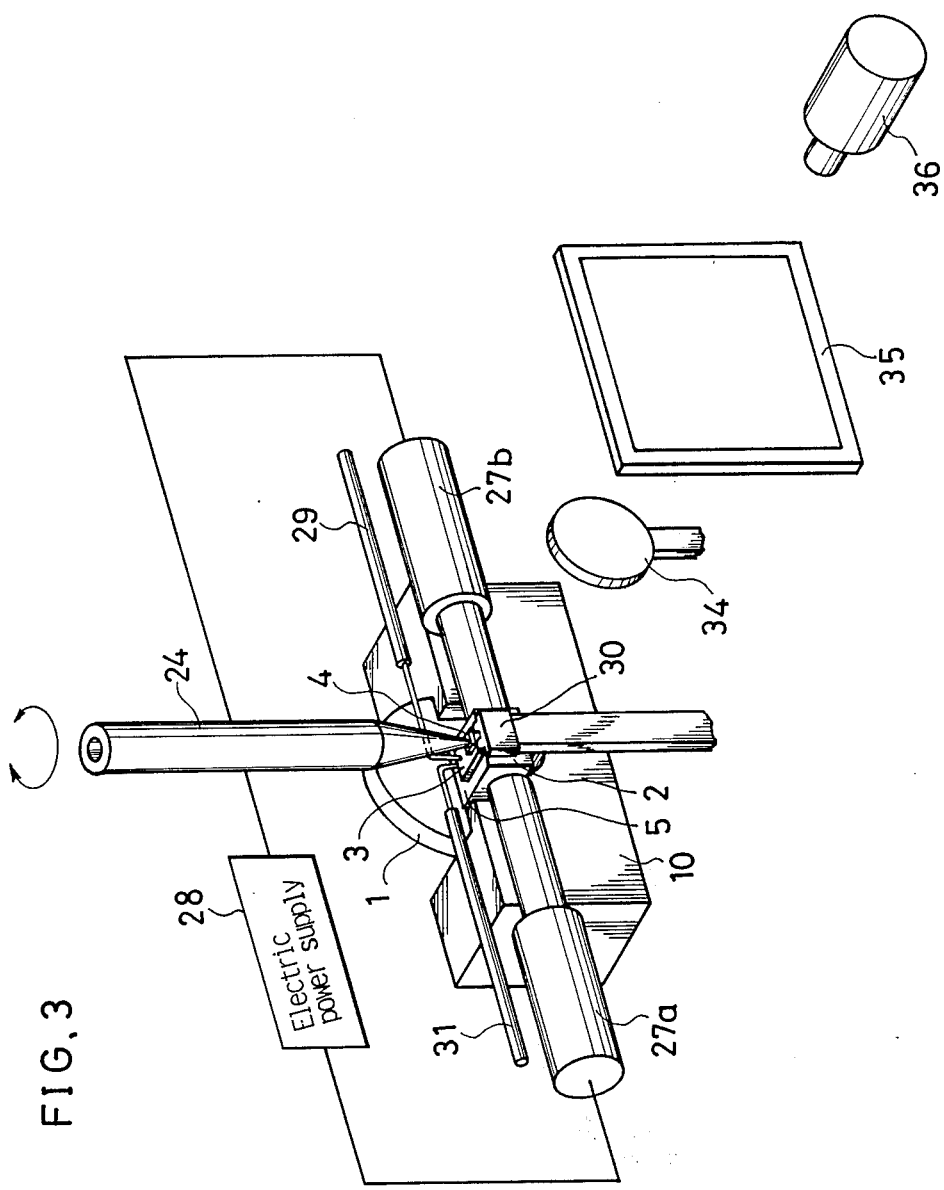
FIG. 3 is a perspective view showing a bonding portion of the embodiment.

An intermediate chip adjusting part 19 for adjusting a position of the intermediate chip 3 is provided on a control portion between the intermediate chip supplying part 16 and the stem holder 10. A transfer device 20 for transferring the intermediate chip 3 is placed beside the intermediate chip supplying part 16. The transfer device 20 is provided with pickup devices 20a and 20b on both ends, and when the pickup device 20a is positioned on the tray 18, the other pickup device 20b is positioned on the intermediate adjusting part 19. Both the ends 20a and 20b comprise suction tubes at their respective lower ends, and when the transfer device 20 is moved downward, the respective suction tubes suck the intermediate chips 3. Then, the transfer device 20 is lifted up and is shifted to rightward. The intermediate chip 3 sucked by the pickup device 20a is placed on the intermediate adjusting part 19, and the intermediate chip 3 sucked on the pickup device 20b is placed, as shown in FIG. 3, on the bonding surface 5 of the pedestal 2 of the stem 1 which is positioned on the stem holder 10. At this time, the chip is moveably located so that it can be corrected of its direction by known correcting means using four clamping members.

Figure 4:
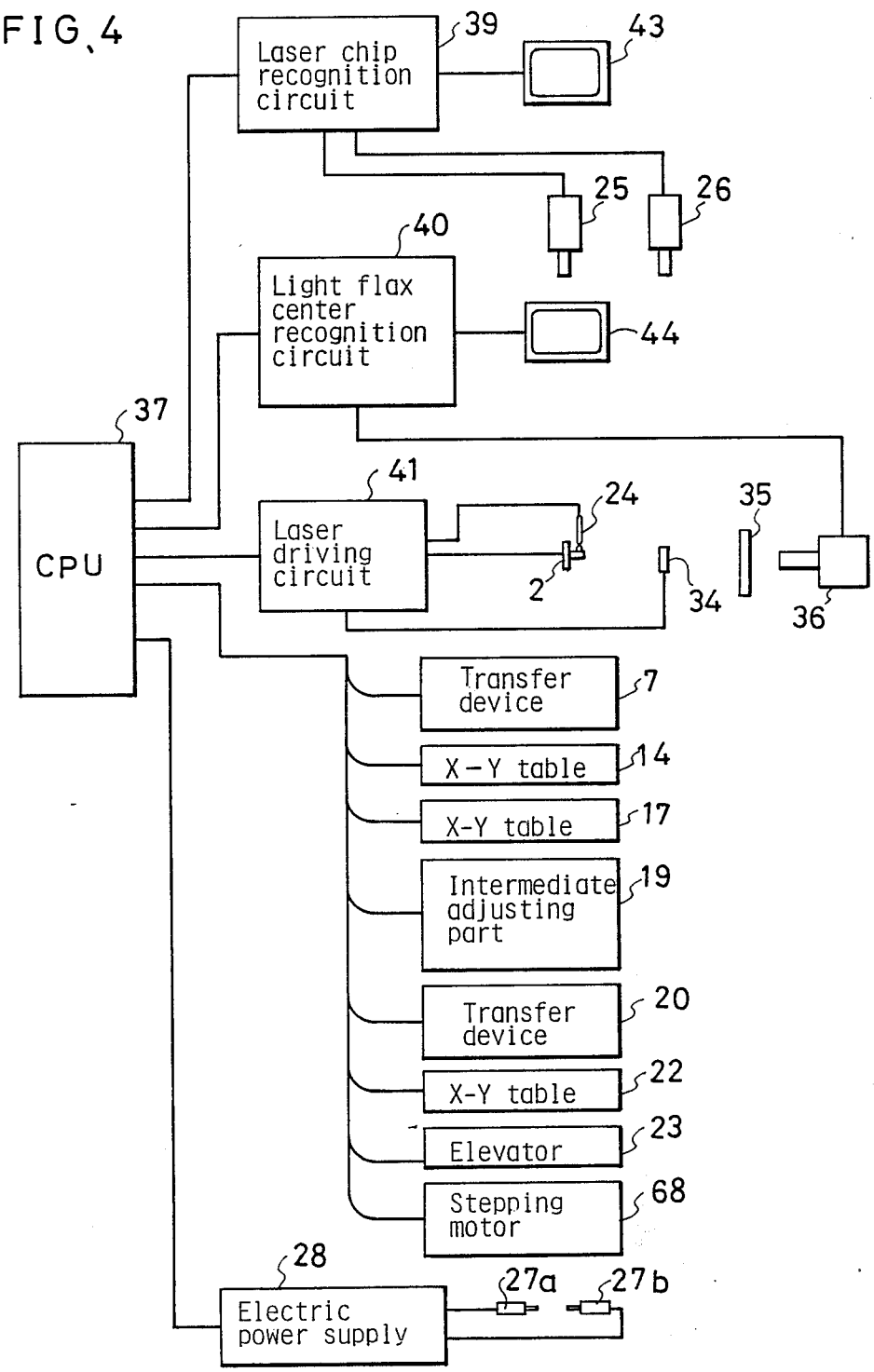
FIG. 4 is a block diagram of the apparatus.

A laser chip mounting device 21 is provided over the positioning device 12, and comprises an X-Y table 22, an elevator 23 mounted on the X-Y table 22, and a pickup device 24 mounted on the elevator 23 rotatable by a stepping motor 68, for example. The pickup device 24 is provided with a suction tube at the lower end for sucking the laser chip 4. A sucked position recognition device 25 for recognizing a sucked position of the laser chip 4 of the pickup device 24 is provided in front of the stem holder 10. The laser chip 4 on the tray 15 is sucked by the pickup device 24 by operation of the X-Y table 22 and the elevator 23. The pickup device 24 is shifted over the sucked position recognition device 25. The sucked position recognition device 25 comprises a video camera therein and the sucked position is recognized by a known process which uses a video image signal detected by the sucked position recognition device 25. The, the pickup device 24 is shifted over the pedestal 2 which is positioned by the stem holder 10. The position and direction of the laser chip 4 is precisely adjusted by the X-Y table 22 and the stepping motor 68, respectively, and is mounted on the intermediate chip 3. A chip recognition device 26 for detecting the laser chip 4 is disposed over the tray 15, and also comprises a video camera. The laser chip 4 on the tray 15 is detected by a video camera of the chip recognition device 26, and the center and the direction of the laser chip 4 is recognized by known video signal processing means prior to sucking by the pickup device 24. Data detected by the chip recognition device 26 is applied to the X-Y table 22 through feedback system of the laser chip recognition circuit 39 as shown in FIG. 4, and the X-Y table 22 is controlled corresponding to the data.

A detailed constitution of the above-mentioned positioning part including the stem holder 10 is shown in FIG. 3. Referring to FIG. 3, the stem 1 is held by the stem holder 10, and the pedestal 2 protrudes from an opening of the stem holder 10. A pair of electrodes 27a and 27b which are provided in front of the stem holder 10 clamping the pedestal 2 at both sides thereof. The electrodes 27a and 27b are connected with an electric power supply 28, and heats the pedestal 2 for bonding the laser chip 4 and the intermediate chip 3 therethrough.

In order to position the intermediate chip 3 on the pedestal 2, a chip holder 29 is provided over the stem holder 10 and presses the intermediate chip 3 to the bonding surface 5 of the pedestal 2, and a rear face 3a of the intermediate chip 3 is positioned by a positioning member 31. Detailed arrangements of the chip holder 29 and the positioning member 31 are shown in FIG. 5(a), FIG. 5(b), FIG. 5(c) and FIG. 5(d). Furthermore, a front surface 3b of the intermediate chip 3 is positioned by a positioning plate 30 which is placed in front of the stem holder 10. Therefore, the intermediate chip 3 is positioned between the positioning member 31 and the positioning plate 30.

Figure 6:
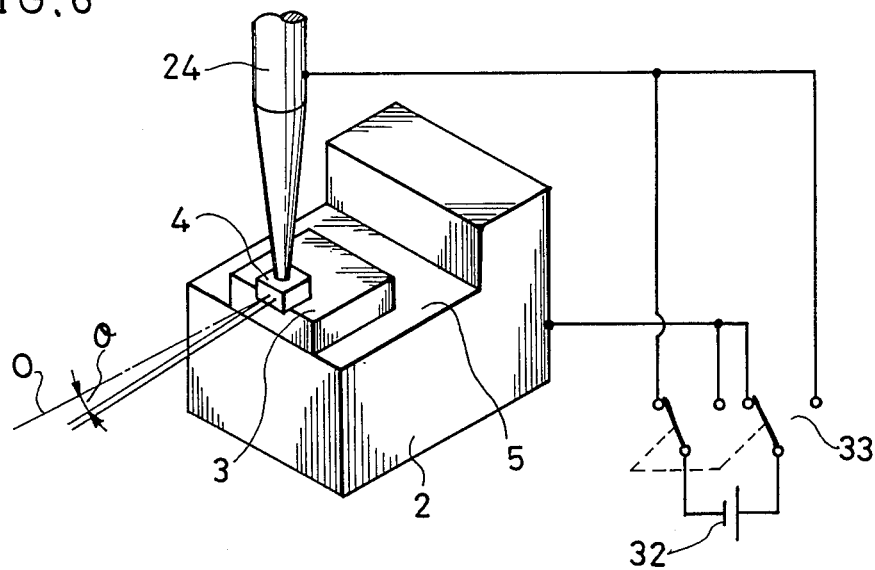
FIG. 6 is a perspective view showing light emission of a laser chip.

As shown in FIG. 6, a DC voltage from a DC power supply 32 for driving the semiconductor laser is applied across the stem holder 10 and the pickup device 24. The polarity of the DC voltage is switched by a switch 33. The positive terminal of the DC power supply 32 is connected to the pickup device 24 in case of N-type laser chip, and the negative terminal of the DC power supply 32 is connected to the pickup device 24 in case of P-type laser chip.

An emitted light detecting device 34 for detecting an emitted light of the laser chip 4 is provided in front of the stem holder 10 as shown in FIG. 3. The emitted light detecting device 34 consists of a solar battery and is provided with a retractable mechanism (not shown). The emitted light detecting device 34 is positioned in front of the laser chip 4, which is mounted on the intermediate chip 3, only when the intensity of the emitted light of the laser chip 4 is inspected. A screen 35 and a light beam center recognition device 36 are also provided in front of the stem holder 10. A light from the laser chip 4 is projected to the screen 35 and the light beam center recognition device 36 having a video camera therein detects the image of the screen 35. A center of the light beam on the screen 35 is recognized by the video signal corresponding to the image.

A block diagram showing connection of the respective devices is shown in FIG. 4. Referring to FIG. 4, the detected signals of the sucked position recognition device 25 and the chip recognition device 26 are given to a lser chip recognition circuit 39, and the detected signal of the light beam center recognition device 36 is given to a light beam center recognition circuit 40. The laser chip recognition circuit 39 and the light beam center recognition circuit 40 are provided with respective video displays 43 and 44, and the respective video images can be observed by an operator.

The above-mentioned circuits and the actuators of the X-Y tables and the transfer devices are operatively coupled to a CPU 37 of a computer system.

Figure 1:
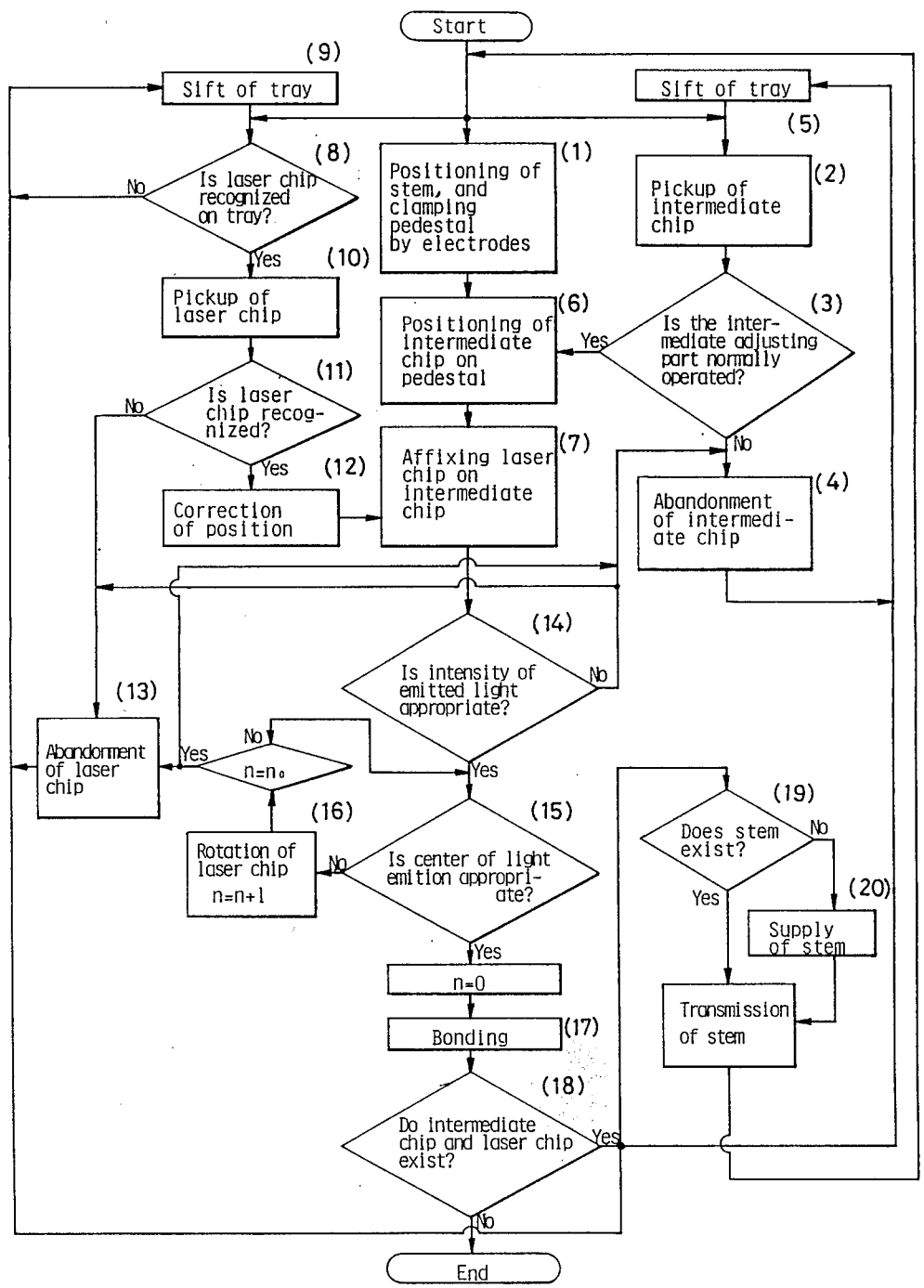
FIG. 1 is a flow chart showing an operation of a bonding method in accordance with the present invention.

The operation of the apparatus is shown by a flow chart in FIG. 1.

Firstly, a stem 1 is transferred from the transfer device 7 to the stem holder 10 by the positioning device 12. Then, the pedestal 2 of the stem 1 is clamped at both sides thereof by the electrodes 27a and 27b (step 1).

An intermediate chip 3 is picked up from the intermediate chip supplying part 16 by the transfer device 20, and is placed on the intermediate adjusting part 19 (step 2). Then, the position of the intermediate chip 3 is corrected by the intermediate adjusting part 19 (step 3). In step 3, when the intermediate adjusting part 19 has failed to correct appropriately the position of the intermediate chip 3, use of the intermediate chip 3 is abandoned and removed (chip 4), and a new intermediate chip 3 is supplied on the intermediate adjusting part 19 a by shift of the tray 18 (steps 2, 3 and 5). Subsequently, the intermediate chip 3 is supplied on the pedestal 2 and is positioned thereon (step 6). The detailed process of the positioning of the intermediate chip 3 is described with reference to in FIG. 5, FIG. 5(b), FIG. 5(c) and FIG. 5(d).

Figure 5A:
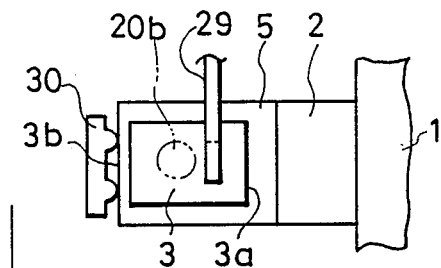
FIG. 5(a), FIG. 5(b), FIG. 5(c) and FIG. 5(d) are process charts showing positioning of an intermediate chip.
Figure 5B:
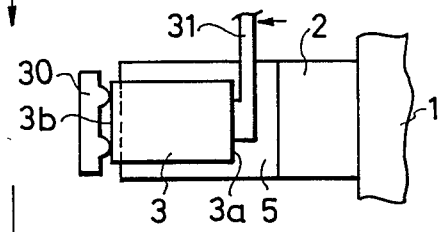
Figure 5C:
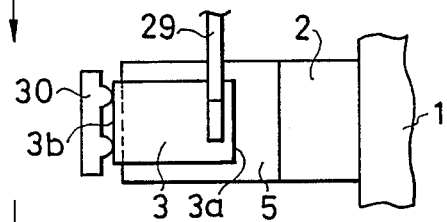
Figure 5D:
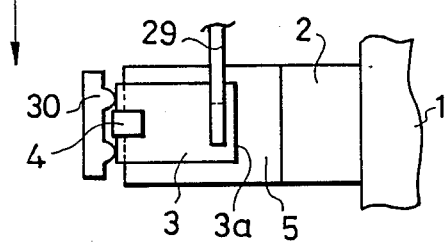

Firstly, after supplying of the intermediate chip 3 on the bonding surface 5 of the pedestal 2, the intermediate chip 3 is pressed at its upper surface by the chip holder 29 as shown in FIG. 5(a). Secondly, after release of the chip holder 29, the intermediate chip 3 is pushed at its rear face 3a by the positioning member 31, and the front face 3b of the intermediate chip 3 is pressed to the positioning plate 30 as shown in FIG. 5(b). Thirdly, the chip holder 29 again press the positioned intermediate chip 3 as shown in FIG. 5(c) in order to prevent slip. Then, a laser chip 4 is set on a predetermined position of the intermediate chip 3 as shown in FIG. 5(d) (step 7).

Prior to supply of the laser chip 4 on the intermediate chip 3, a central position and a direction of the laser chip 4 on the tray 15 is recognized by the chip recognition device 26 (step 8). When the central position and the direction of the laser chip 4 is out of an appropriate range, the tray 15 is moved by the X-Y table 14 (step 9), and the laser chip 4 is placed at the predetermined position. Then, the laser chip 4 is sucked by the suction tube of the pickup device 24 (step 10). The position of the laser chip 4 on the suction tube is recognized by the sucked position recognition device 25 (step 11). When the sucked position of the laser chip 4 is significantly displaced from the predetermined position or the sucked position recognition device 25 have failed to recognize the laser chip 4 due to defect of sucking operation, the laser chip 4 is abandoned (step 13). And a new laser chip 4 is sucked again, the sucked position of the laser chip 4 is recognized again by the sucked position recognition device 25. When the laser chip 4 is recognized by the sucked position recognition device 25, the position and the rotated angle of the laser chip 4 with respect to a central axis of the pickup device 24 are detected. Subsequently, the declination of their position and rotated angle are corrected by rotation of the pickup device 24 and shift of the X-Y table 22 (step 12). Then the pickup device 24 is shifted over the stem holder 10 by the X-Y table 22, and the laser chip 4 sucked at the suction tube of the pickup device 24 is mounted on a predetermined position of the intermediate chip 3 (step 7).

Figure 10:
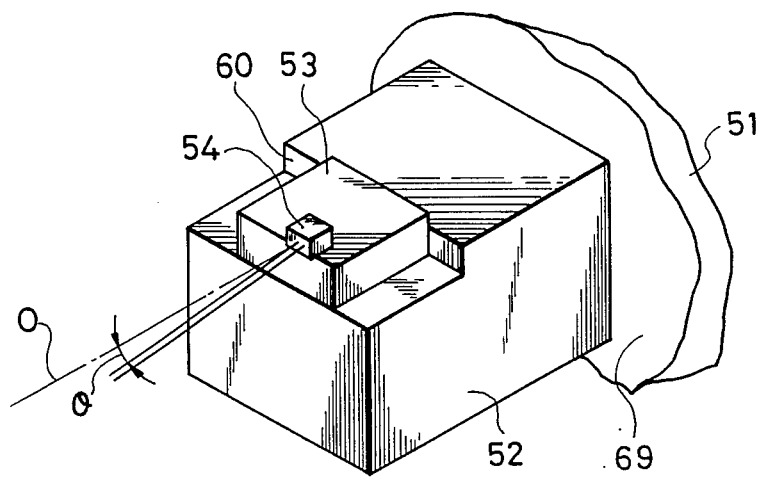
FIG. 10 is the perspective view of the main portion as shown in FIG. 9.
Figure 11A:
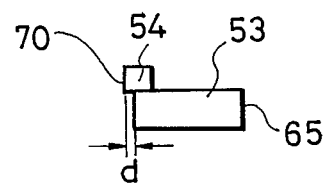
FIG. 11(a) and FIG. 11(b) are the side views of the main portion of the semiconductor laser in the prior art.
Figure 11B:
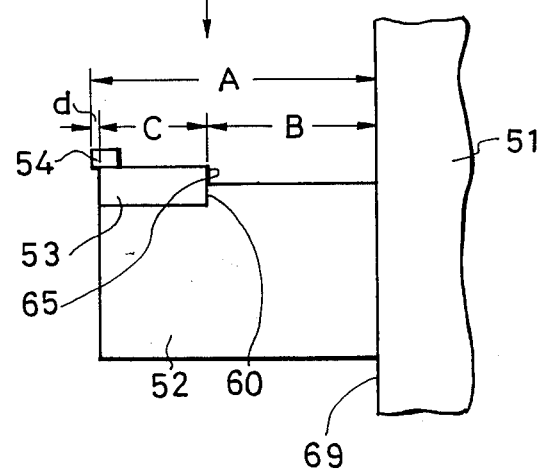

As shown in FIG. 6, since the DC voltage from the DC current power source 32 is applied to the laser chip 4, through the pickup device 24 and through the pedestal 5 and the intermediate chip 3, the laser chip 4 radiates laser light. The emitted light is detected by the emitted light detecting device 34 (of FIG. 2), and when the intensity of the emitted light is not within a predetermined range, the intermediate chip 3 and the laser chip 4 are abandoned (step 4 and 13). When the intensity of the emitted light is within the predetermined range, the emitted light detecting device 24 is shifted from the front of the laser chip 4 to an under portion of the stem holder 10. As a result, the radiated light beam from the laser chip 4 is projected on the screen 35. The image on the screen 35 is detected by the light beam center recognition device 36. Then the center of the light beam is recognized by the light center recognition circuit 40, and it is examined whether the center of the light beam of the laser chip 4 coincides with a reference axis "O" (of FIG. 10) which is formed on the basis of the pedestal 2 within a predetermined reference angle "θ" (step 15).

If the center of the light beam of the laser chip 4 is out of the predetermined range of reference angle "θ", the laser chip 4 is lifted with the pickup device 24. Then, the pickup device 24 is rotated by a predetermined very small amount of angle (step 16), and is moved downward to mount the laser chip 4. Then, then center of the light beam is again recognized by the light beam center recognition circuit 40, and is examined whether the center of the light beam coincides with a reference axis "O" within the predetermined reference angle "θ" (step 15). If the center of the light beam does not coincide with a reference axis "O" within the predetermined reference angle "θ", the laser chip 4 is lifted up with the pickup device 24 and rotated the predetermined very small amount of angle. And in the same way, the examination of the center of the light beam of the laser chip 4 is repeated. When the center of the light beam of the laser chip 4 does not coincide with the reference axis "O" by repetition of the above-mentioned operation of several times, the laser chip 4 and the intermediate chip 3 are abandoned (step 4 and 13).

When the center of the light beam of the laser chip 4 coincides with the provisional axis "O " within the predetermined reference angle "θ", the electric power supply 28 feeds a current through the electrode 27a and 27b clamping the pedestal 2. Consequently, the pedestal 2 is heated. Since the gold layers contact with the tin layers at the surfaces of contact of the pedestal 2, the intermediate chip 3 and the laser chip 4, their layers result in eutectic mixture at a temperature of 290° C. Therefore, the pedestal 2, the intermediate chip 3 and the laser chip 4 are bonded simultaneously (step 17).

After the finish of the above-mentioned process of bonding, remainings of the stem 1 in the transfer device 7, the intermediate chip 3 on the tray 18 and the laser chip 4 on the tray 15 are detected by the respective detecting means (not shown) (step 18). When either one of them fails to exist, the operation of the bonding apparatus is interrupted. When both the intermediate chip 3 and the laser chip 4 exist, existance of the stem 1 is checked (step 19). When the stem 1 does not exist in the transfer device 7, the stems are supplied (step 20). Then, the stem 1 is transferred to the positioning part (step 21). Then, further bonding process is started from the step 1.

Though the pedestal 2 is made of copper and the intermediate chip 3 is made of silicon in the above-mentioned embodiment, these materials are freely selected.

In another embodiment, the laser chip 4 can be directly bonded on the pedestal 2. In the embodiment, the processes for transferring the intermediate chip 3 are deleted.

According to the bonding method in accordance with the present invention, since the direction of the emitted light of the laser chip is inspected and corrected prior to bonding, declination of the center of the light beam of the laser light is reduced within the predetermined allowable error range, and thereby, a yield rate in fabrication of the semiconductor laser can be significantly improved.

What is claimed is:

1. A method for bonding a semiconductor laser element comprising:

a step for movably locating a laser chip on a stem of a semiconductor laser device, a step for supplying an electric current to said movably located laser chip to cause said laser chip to emit a laser light, a step for examining an intensity of said emitted laser light, a step for detecting a central axis of a light beam of said emitted laser light;

a step for measuring a difference between a direction of said central axis and a predetermined direction, a step for adjusting a portion of said laser chip until said difference becomes within a predetermined range, and a step for bonding said laser chip on the stem by passing a current therethrough, when said difference becomes within said predetermined range.

2. An apparatus for bonding a semiconductor laser element comprising:

means for movably locating a laser chip on a stem of a semiconductor laser device, means for supplying an electric current to said movably located laser chip to cause said laser chip to emit a laser light, means for examining an intensity of said emitted laser light, means for detecting a central axis of a light beam of said emitted laser light and measuring a difference between a direction of said central axis and a predetermined direction, means for adjusting said laser chip until said difference becomes within a predetermined range, and means for bonding said laser chip on the stem by passing a current therethrough when said difference becomes within said predetermined range.

* * * * *